(12) United States Patent
Yu

(10) Patent No.: US 9,362,243 B2
(45) Date of Patent: Jun. 7, 2016

(54) SEMICONDUCTOR PACKAGE DEVICE AND FORMING THE SAME

(71) Applicant: TAIWAN SEMICONDUCTOR MANUFACTURING COMPANY LTD., Hsinchu (TW)

(72) Inventor: Tsung-Yuan Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/283,716

(22) Filed: May 21, 2014

(65) Prior Publication Data

US 2015/0340329 A1 Nov. 26, 2015

(51) Int. Cl.
*H01L 23/00* (2006.01)
*H01L 23/31* (2006.01)
*H01L 23/525* (2006.01)

(52) U.S. Cl.
CPC ............ *H01L 24/05* (2013.01); *H01L 23/3114* (2013.01); *H01L 24/02* (2013.01); *H01L 24/11* (2013.01); *H01L 24/16* (2013.01); *H01L 23/525* (2013.01); *H01L 2224/0213* (2013.01); *H01L 2224/0231* (2013.01); *H01L 2224/02373* (2013.01); *H01L 2224/11* (2013.01)

(58) Field of Classification Search
CPC .............. H01L 23/485; H01L 23/4824; H01L 23/49513; H01L 24/05; H01L 23/3114; H01L 24/02; H01L 24/16; H01L 24/11; H01L 23/525
See application file for complete search history.

(56) References Cited

U.S. PATENT DOCUMENTS

| | | | |
|---|---|---|---|
| 5,326,428 A * | 7/1994 | Farnworth et al. | 324/724 |
| 5,578,526 A * | 11/1996 | Akram et al. | 438/107 |
| 5,726,501 A * | 3/1998 | Matsubara | 257/778 |
| 6,074,897 A * | 6/2000 | Degani et al. | 438/115 |
| 6,613,662 B2 * | 9/2003 | Wark et al. | 438/613 |
| 6,841,872 B1 * | 1/2005 | Ha et al. | 257/736 |
| 7,096,581 B2 * | 8/2006 | Thomas et al. | 29/841 |
| 7,391,117 B2 * | 6/2008 | Kirby et al. | 257/773 |
| 7,728,431 B2 * | 6/2010 | Harada et al. | 257/750 |
| 7,977,789 B2 * | 7/2011 | Park | 257/737 |
| 8,456,022 B2 * | 6/2013 | Hammedinger et al. | 257/779 |
| 8,637,986 B2 * | 1/2014 | Masuda et al. | 257/739 |
| 9,245,833 B2 * | 1/2016 | Chen | H01L 23/49811 |
| 2015/0014846 A1 * | 1/2015 | Lai | H01L 24/05 257/737 |

* cited by examiner

*Primary Examiner* — William Coleman
(74) *Attorney, Agent, or Firm* — WPAT, P.C., Intellectual Property Attorneys; Anthony King

(57) ABSTRACT

In some embodiments in accordance with the present disclosure, a semiconductor device having a semiconductor substrate is provided. A metal structure is disposed over the semiconductor substrate, and a post-passivation interconnect (PPI) is disposed over the metal structure. In addition, the upper surface of the PPI is configured to receive a bump thereon. In certain embodiments, the upper surface of the PPI for receiving the bump is substantially flat. A positioning member is formed over the PPI and configured to accommodate the bump. In some embodiments, the positioning member is configured to limit bump movement after the bump is disposed over the PPI so as to retain the bump at a predetermined position.

20 Claims, 6 Drawing Sheets

US 9,362,243 B2

SEMICONDUCTOR PACKAGE DEVICE AND FORMING THE SAME

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump is disposed on the surface of a semiconductor substrate. The bump is then treated to maintain its position on the semiconductor substrate.

In addition to Flip-chip packaging, wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films. Thereafter, bumps are disposed on the semiconductor wafer and are expected to maintain position at certain locations. Due to the miniature scale of modern integrated circuits, maintaining bump position has become a challenge. Bump bridging and/or shifting issues have been affecting the yield. As a result, there is a need to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
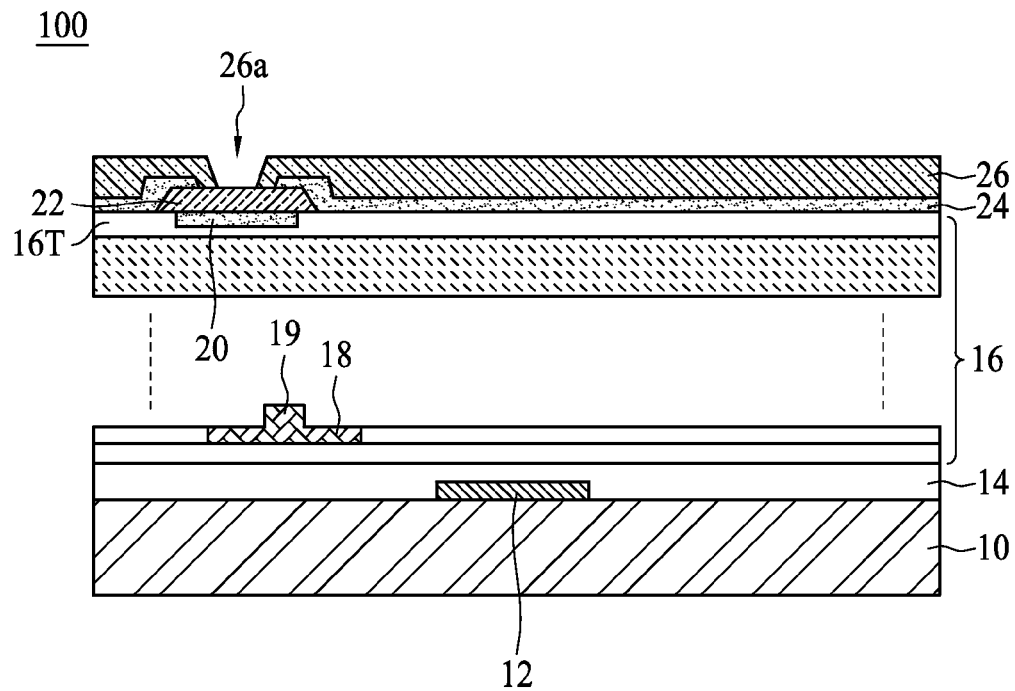
FIGS. 1-5 are cross-sectional views illustrating various intermediate stages of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the drawings, like reference numbers are used to designate like or similar elements throughout the various views, and illustrative embodiments of the present disclosure are shown and described. The figures are not necessarily drawn to scale, and in some instances the drawings have been exaggerated and/or simplified in places for illustrative purposes only. One of ordinary skill in the art will appreciate the many possible applications and variations of the present disclosure based on the following illustrative embodiments of the present disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, substrate can refer either to the work piece upon which deposition is desired, or the surface exposed to one or more deposition gases. For example, in certain embodiments, the substrate is a single crystal silicon wafer, a semiconductor-on-insulator ("SOI") substrate, or an epitaxial silicon surface, a silicon germanium surface, or an III-V material deposited upon a wafer. Work pieces are not limited to wafers, but also include glass, plastic, or other substrates employed in semiconductor processing. In some embodiments, the substrate has been patterned to have two or more different types of surfaces, such as both semiconductor and insulator surfaces. Examples of insulator materials include silicon dioxide, including low dielectric constant forms, such as carbon-doped and fluorine-doped oxides of silicon, silicon nitride, metal oxide and metal silicate. In certain embodiments, silicon-containing layers are selectively formed over single crystal semiconductor materials while allowing for minimal or zero growth of material over adjacent insulators. According to some embodiments, any material growth over adjacent insulators may be amorphous or polycrystalline non-epitaxial growth.

In certain embodiments, the word "substrate" in the present disclosure represents a patterned substrate that has a first surface having a first surface morphology and a second surface having a second surface morphology. Even if surfaces are made from the same elements, the surfaces are considered different if the morphologies or crystallinity of the surfaces are different. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by an in-plane crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial despite a low density of faults. Specific examples of patterned substrates having two or more different types of surfaces, whether due to different morphologies and/or different materials, include without limitation: single crystal/polycrystalline, single crystal/amorphous, single crystal/dielectric, conductor/dielectric, and semiconductor/dielectric.

FIGS. 1-5 are cross-sectional views illustrating various intermediate stages of a method of forming a semiconductor device in accordance with some embodiments of the present disclosure.

Referring first to FIG. 1, in some embodiments in accordance with the present disclosure, a portion of a semiconductor substrate 10 of a semiconductor device 100 is provided. The semiconductor substrate 10 includes an electrical circuitry 12 formed thereon. The semiconductor substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used.

In some embodiments in accordance with the present disclosure, electrical circuitry 12 formed on the semiconductor substrate 10 may be any type of circuitry suitable for a particular application. In certain embodiments, the electrical circuitry 12 includes electrical devices formed on the semiconductor substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

In some embodiments in accordance with the present disclosure, an inter-layer dielectric (ILD) layer 14 is disposed over the semiconductor substrate 10 and the electrical circuitry 12. The ILD layer 14 may be formed, for example, of a low-K dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). It should also be noted that the ILD layer 14 may comprise a plurality of dielectric layers. Contacts (not shown) may be formed through the ILD layer 14 to provide an electrical contact to the electrical circuitry 12. The contacts may be formed of, for example, one or more layers of TaN, Ta, TiN, Ti, CoW, copper, tungsten, aluminum, silver, or the like, or combinations thereof.

In some embodiments in accordance with the present disclosure, one or more inter-metal dielectric (IMD) layers 16 and the associated metallization layers are formed over the ILD layer 14. Generally, the one or more IMD layers 16 and the associated metallization layers (including metal lines 18, vias 19 and metal layer 20) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. It should be noted that one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In certain embodiments, etch stop layers may be formed of SiN, SiCN, SiCO, CN, combinations thereof, or the like, deposited by CVD or PECVD techniques.

In some embodiments in accordance with the present disclosure, the metallization layers, including metal lines 18 and vias 19, may be formed of copper or copper alloys, although they can also be formed of other metals. Furthermore, the metallization layers include a top metal layer 20 formed and patterned in or on the uppermost IMD layer 16T to provide external electrical connections and to protect the underlying layers from various environmental contaminants. The uppermost IMD layer 16T may be formed of a dielectric material, such as silicon nitride, silicon oxide, undoped silicon glass, and the like.

In some embodiments in accordance with the present disclosure, thereafter, a conductive pad 22 is formed over and is in contact with the top metal layer 20. Alternatively, the conductive pad 22 is electrically coupled to the top metal layer 20 through a via (not depicted). In certain embodiments, the conductive pad 22 is formed of aluminum, aluminum copper, aluminum alloys, copper, copper alloys, or the like.

In some embodiments in accordance with the present disclosure, one or more passivation layers, such as passivation layer 24, are formed over the conductive pad 22 and the uppermost IMD layer 16T. In addition, the passivation layer 24 is patterned to expose a portion of the conductive pad 22. In certain embodiments, the passivation layer 24 is patterned to cover the peripheral portion of the conductive pad 22 and to expose the central portion of the conductive pad 22. The patterning method of the passivation layer 24 may include masking, lithography, etching or combinations thereof. Moreover, the passivation layer 24 may be formed of a dielectric material, such as undoped silicate glass (USG), silicon nitride, silicon oxide, silicon oxynitride or a non-porous material by any suitable method, such as CVD, PVD, or the like. In certain embodiments, the passivation layer 24 may be a single layer or a laminated layer. One of ordinary skill in the art will appreciate that a single layer of conductive pad and a passivation layer are shown for illustrative purposes only. As such, other embodiments may include any number of conductive layers and/or passivation layers.

In some embodiments in accordance with the present disclosure, a dielectric 26 is formed on the passivation layer 24. The dielectric 26 is the patterned to form an opening 26a, through which at least a portion of the conductive pad 22 is exposed again. The dielectric 26 may be, for example, a polymer layer. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods. In some embodiments, the dielectric 26 is an optional layer, which can be skipped in the semiconductor device.

In subsequent drawings, semiconductor substrate 10, electrical circuitry 12, ILD layer 14, IMD layers 16, and metallization layers 18 and 19 may not be illustrated for simplicity. In addition, the top metal layer 20 is formed as a part of the IMD layer 16.

Figure 2:
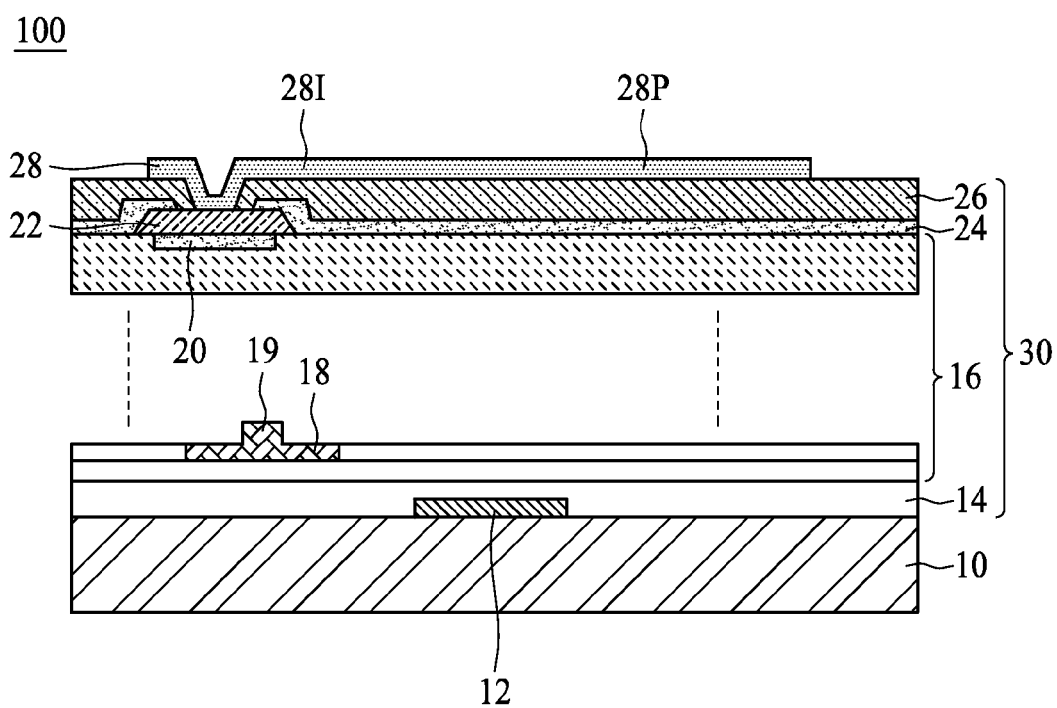

With reference to FIG. 2, in some embodiments in accordance with the present disclosure, a post-passivation interconnect (PPI) 28 having an upper surface is formed over the dielectric 26. In some embodiments, the upper surface of the PPI 28 is substantially flat. In certain embodiments, the PPI 28 is configured to line the sidewalls and bottom of the opening 26a. In some embodiments, the PPI 28 is configured to fill the opening 26a. Accordingly, the PPI 28 is electrically connected with the conductive pad 22. The PPI 28 that is an interconnect layer includes an interconnect line region 28I and a landing pad region 28P. The interconnect line region 28I and the landing pad region 28P may be formed simultaneously, and may be formed of a same conductive material. In certain embodiments, the interconnect line region 28I extends to electrically connect the conductive pad 22 through the opening 26a, and a bump feature will be formed over and electrically connected to the landing pad region 28P in subsequent processes. The PPI 28 may include, but is not limited to, for example copper, aluminum, copper alloy, or other mobile conductive materials using plating, electroless plating, sputtering, chemical vapor deposition methods, and the like. In some embodiments, the PPI 28 may further include a nickel-containing layer (not shown) on top of a copper-containing layer. In certain embodiments, the PPI 28 may also function as power lines, re-distribution lines (RDL), inductors, capacitors or any passive components. Through the routing of PPI 28, the landing pad region 28P may be, or may not be, directly over the conductive pad 22.

In some embodiments in accordance with the present disclosure, the electrical circuitry 12, ILD layer 14, IMD layers 16, the metallization layers 18 and 19, the top metal layer 20, the conductive pad 22, the passivation layer 24 and/or the dielectric 26 are considered as a metal structure 30. Through the design and patterns at the metal structure 30, elements at the semiconductor device 100 may form an electrical connection with any device external to the semiconductor device 100.

Figure 3:
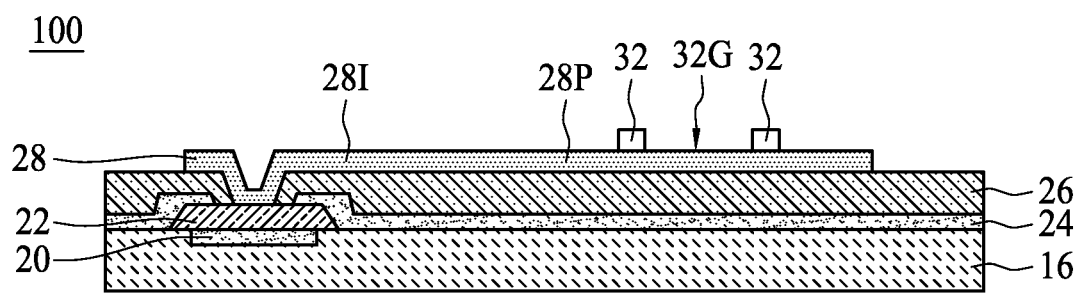

With reference to FIG. 3, in some embodiments in accordance with the present disclosure, a positioning member 32 is formed over the PPI 28. The positioning member 32 is made by the use of depositing methods, photo lithography methods, etching methods, epoxy stencil, or other suitable semiconductor manufacturing method. In certain embodiments, the positioning member 32 is formed at the landing pad region 28P, over which a bump will be formed in subsequent processes. In some embodiments, the positioning member 32 includes at least two portions protruding from the PPI 28 such that a groove 32G is formed at the upper surface of the PPI 28. Such groove 32G is configured to accommodate the bump to be formed in subsequent processes. In other words, the groove 32G is configured in a dimension that substantially conforms to that of the bump to be formed. In addition, the at least two protruding portions of the positioning member 32 is configured to clip the bump and limit the movement of the bump once the bump is disposed on the upper surface of the PPI 28. In certain embodiments, the bump is to be retained at a predetermined position, such as the central portion of the groove 32G or of the at least two protruding portions of the positioning member 32.

In some embodiments in accordance with the present disclosure, the positioning member 32 includes a cavity (not depicted) for accommodating the bump. For example, the positioning member 32 may have a lower central portion and a higher peripheral portion such that the positioning member is substantially bowl-shaped. Accordingly, the bottom of the bowl-shaped positioning member 32 can be configured to accommodate a bump. In addition, the movement of the bump may be constrained due to the higher peripheral portion of the positioning member 32, which serves as a wall. Consequently, the position of the bump may be maintained at a predetermined position, e.g., the central portion of the positioning member 32. It should be noted that the placement of the positioning member 32 is provided for illustrative purposes only and that the specific locations and patterns of the positioning member 32 may vary and may include, for example, an array, a line, a staggered pattern or the like. The illustrated positioning member 32 sizes are provided for reference only and are not intended to be actual sizes or actual relative sizes.

In some embodiments in accordance with the present disclosure, the positioning member 32 is made of a same material as the PPI 28. In certain embodiments, the positioning member 32 is formed of a polymer layer, such as an epoxy, polyimide, benzocyclobutene (BCB), polybenzoxazole (PBO), and the like, although other relatively soft, often organic, dielectric materials may also be used. In some embodiments, the positioning member 32 is formed of a non-organic material selected from undoped silicate glass (USG), silicon nitride, silicon oxynitride, silicon oxide, and combinations thereof.

Figure 4:
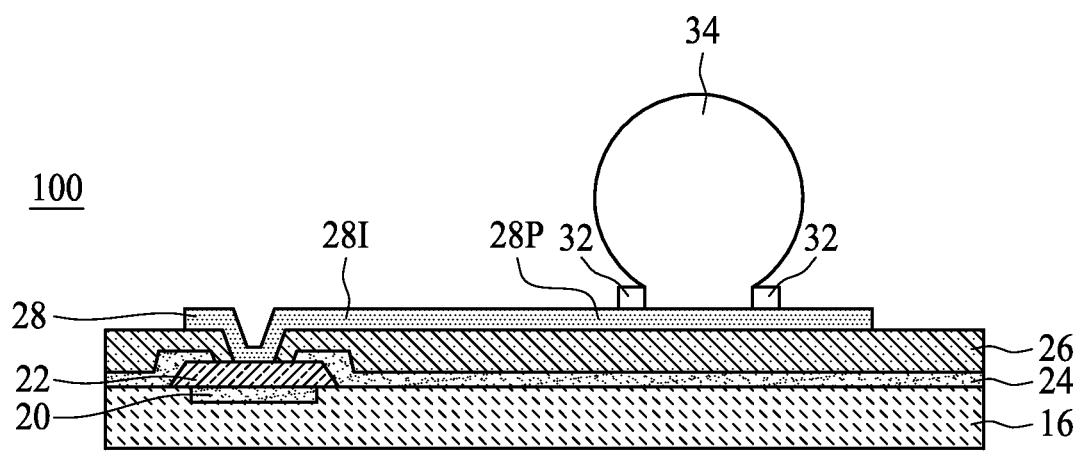

With reference to FIG. 4, in some embodiments in accordance with the present disclosure, a bump 34 is disposed on the upper surface of the PPI 28. As such, the bump 34 is in electrical connection with the semiconductor substrate 10 through the metal structure 30 and the PPI 28. In addition, the bump 34 is disposed at the positioning member 32 and clipped by the protruding portions of the positioning member 32. Through the constraint by the positioning member 32, the bump 34 is secured at a predetermined position at the landing pad region 28P. When several bumps are disposed on the PPI 28, some corresponding positioning members may be deployed to maintain the plurality of bumps at their predetermined positions respectively. As such, the bumps will not move to positions other than the predetermined ones during the semiconductor manufacturing processes. Therefore, electrical connections between the semiconductor device 100 and external devices may be generated through predetermined routes or patterns. Moreover, the plurality of bumps will be separated from each other such that issues such as shortage or bump cross talk may be reduced. In certain embodiments, a pitch between the bumps on the PPI 28 is between about 300 μm and about 500 μm. The pitch between bumps may be measured from the central point of one bump to an adjacent bump, or a right/left most point of one bump to a right/left most point of an adjacent bump.

In some embodiments in accordance with the present disclosure, the bump 34 is formed by attaching a solder ball on the PPI 28 and then reflowing the material. The bump 34 may include a lead-free pre-solder layer, SnAg, or a solder material including alloys of tin, lead, silver, copper, nickel, bismuth, or combinations thereof. A bump structure is therefore completed on the semiconductor device 100. The presented embodiments provide the positioning members 32 on the PPI 28 such that the bump 34 will be retained at a predetermined position when disposed onto the PPI 28. Accordingly, in packaging assembly processes, issues such as bump shift and uneven distribution of stress, which may lead to bump crack, may be reduced.

Figure 5:
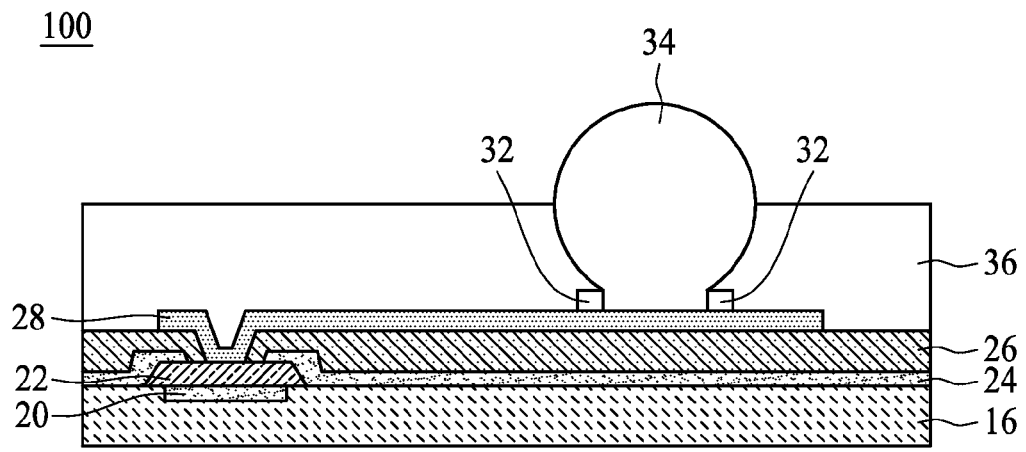

With reference to FIG. 5, in some embodiments in accordance with the present disclosure, after the bump formation, a protective layer 36 is formed over the dielectric 26, PPI 28, the positioning member 32, and at least partially over the bump 34. In other words, the protective layer 36 at least partially encapsulates the bump 34 to ensure the bump 34 is retained at the predetermined position and further enhance the stability of the bump 34. For example, the protective layer 36 serves to prevent the bump 34 from shifting or shaking during the semiconductor manufacturing process. Thereafter, a singulation process may be performed to singulate individual dies, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

In some embodiments in accordance with the present disclosure, the protective layer 36 includes molding compound or encapsulant. In some embodiments, the protective layer 36 may be, for example, a polymer layer. The polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods.

Figure 6:
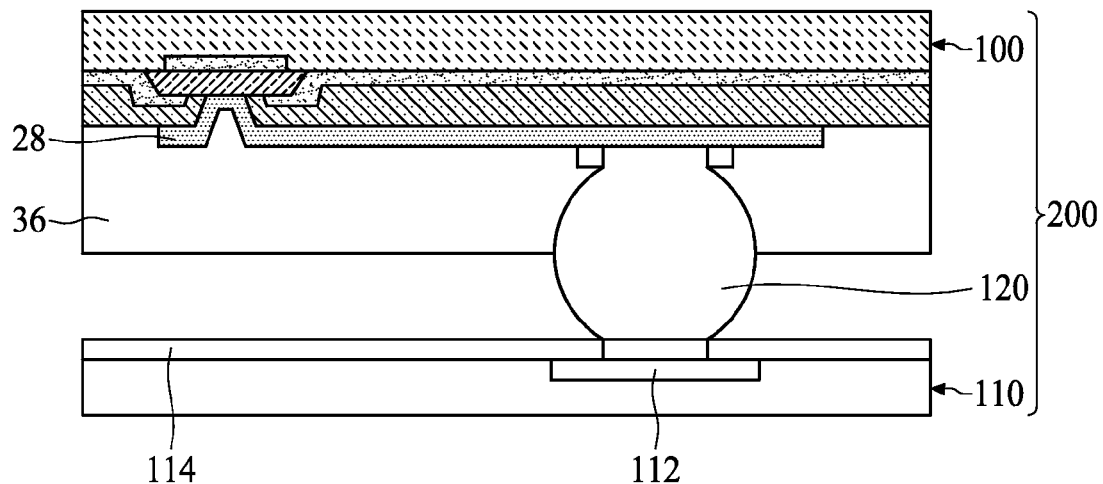
FIG. 6 is a cross-sectional view of a packaging assembly in accordance with some embodiments of the present disclosure.

FIG. 6 is a cross-sectional view of a packaging assembly in accordance with some embodiments of the present disclosure.

In some embodiments in accordance with the present disclosure, the structure shown in FIG. 5 is flipped upside down and attached to another substrate 110 at the bottom of FIG. 6. The substrate 110 may be a package substrate, board (e.g., a printed circuit board (PCB)), a wafer, a die, an interposer substrate, or other suitable substrate. The bump structure is coupled to the substrate 110 through various conductive attachment points. For example, a conductive region 112 is formed and patterned on the substrate 110. The conductive region 112 is a contact pad or a portion of a conductive trace. In some embodiments, a mask layer 114, which is a solder resist layer, is formed and patterned on the substrate 110 to expose the conductive region 112. The mask layer 114 has a mask opening, which provides a window for solder joint formation. For example, a solder layer including alloys of tin, lead, silver, copper, nickel, bismuth, or combinations thereof may be provided on the conductive region 112. The semiconductor device 100 can be coupled to the substrate 110 to form a joint conductor structure 120 between the PPI 28 and the conductive region 112. An exemplary coupling process includes a flux application, chip placement, reflowing of melting solder joints, and/or cleaning of flux residue. The integrated semiconductor device 100, the joint conductor structure 120, and the substrate 110 may be referred to as a packaging assembly 200, or in the present embodiment, a flip-chip packaging assembly.

Figure 7:
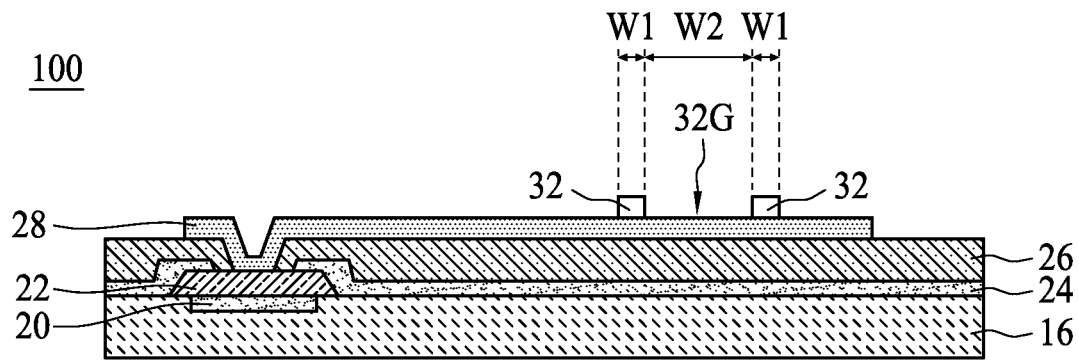
FIGS. 7-8 illustrate various cross-sectional views of a semiconductor device in accordance with some embodiments of the present disclosure.
Figure 8:
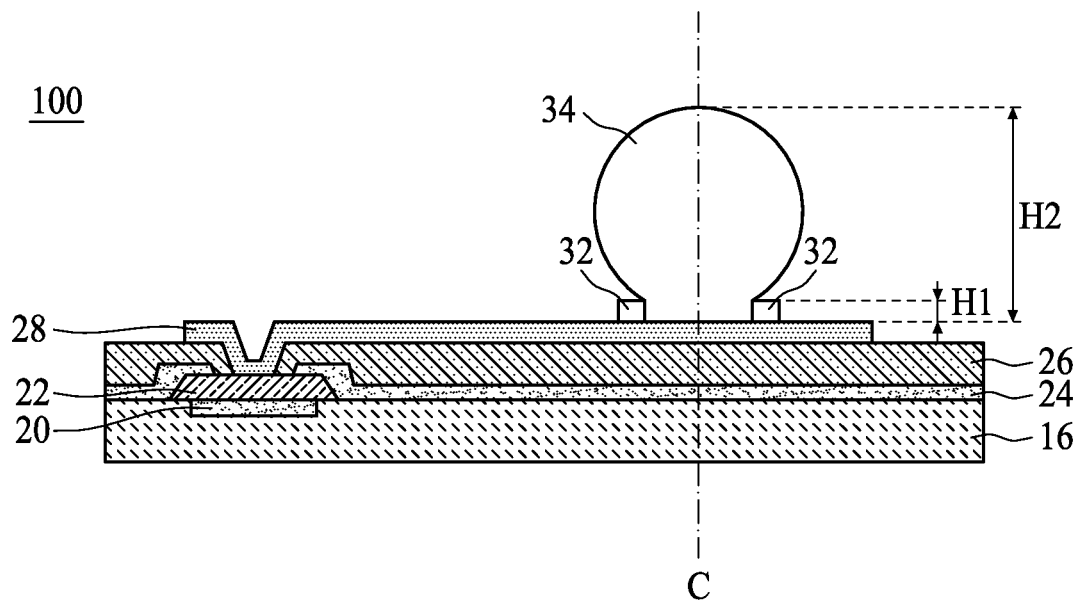

FIGS. 7-8 illustrate various cross-sectional views of a semiconductor device in accordance with some embodiments of the present disclosure. Unless specified otherwise, the reference numerals in these embodiments represent like elements in the embodiments illustrated in FIGS. 1-6.

Referring to FIG. 7, in some embodiments in accordance with the present disclosure, the positioning member 32 is disposed over the PPI 28. Two protruding portions of the positioning member 32 are provided so as to clip the bump later on. The protruding portion of the positioning member 32 has a width of W1, which is between about 25 μm and about 125 μm. In certain embodiments, the width W1 is between about 50 μm and about 100 μm so as to accommodate and secure the position of the bump. The groove 32G formed between the protruding portions of the positioning member 32 has a width W2 of between about 150 μm and about 400 μm. The width W2 may be adjusted in accordance with the diameter of the bump to be placed. In certain embodiments, the width W2 is smaller than the diameter of the bump to be placed such that the bump will be clipped by the positioning member 32 once disposed on the PPI 28.

Referring to FIG. 8, in some embodiments in accordance with the present disclosure, the bump 34 is provided over the PPI 28 and the positioning member 32 serves to maintain the position of the bump 34. In certain embodiments, the protruding portions of the positioning member 32 serves to clip the bump 34 there-between such that the bump 34 may be substantially aligned with a central line C of the positioning member 32. The secured position of the bump 34 serves to reduce the issue of bump shift in later semiconductor manufacturing processes.

In some embodiments in accordance with the present disclosure, the positioning member 32 has a height H1, and the bump 34 has a height H2. In certain embodiments, the height H2 is the radius of the bump 34. The height H1 is proportional to the height H2. Specifically, the height H1 is configured such that the bump 34 will not shift or roll once placed on the PPI 28 while the bump 34 will still be in contact with the upper surface of the PPI 28. In other words, if the height H1 is too large, the bump 34 may be lifted from the surface of the PPI 28 and the electrical connection there-between may be lost. In some embodiments, the height H1 is larger than about 1/10 of the height H2 such that the bump 34 will not shift when placed on the PPI 28 while an electrical connection is maintained between the bump 34 and the PPI 28.

Figure 9:
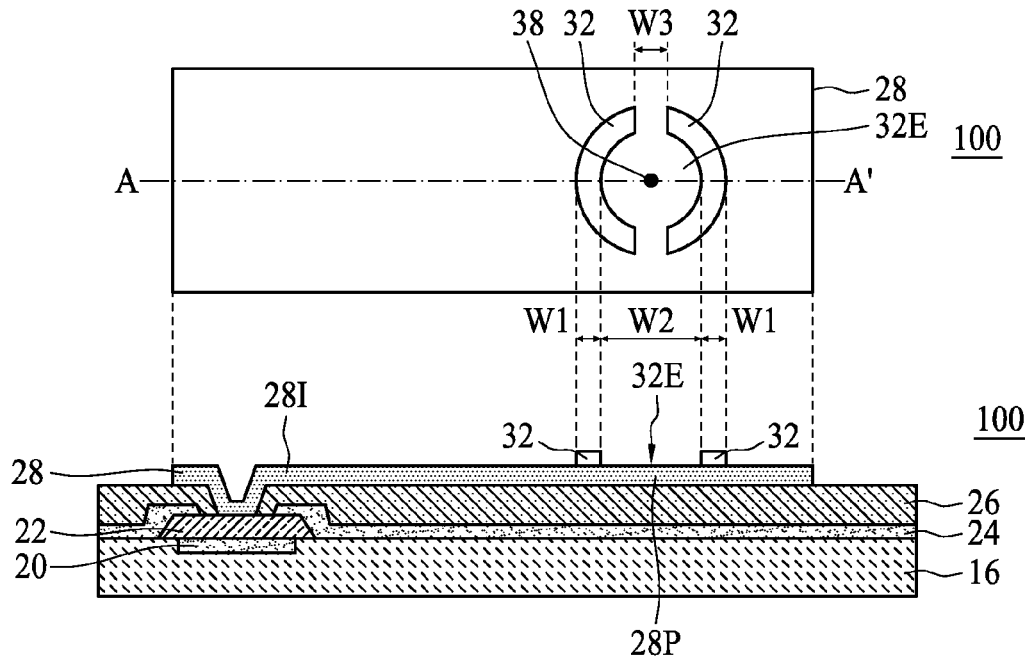
FIGS. 9-11 illustrate various top-views and corresponding cross-sectional views of a semiconductor device in accordance with some embodiments of the present disclosure.
Figure 10:
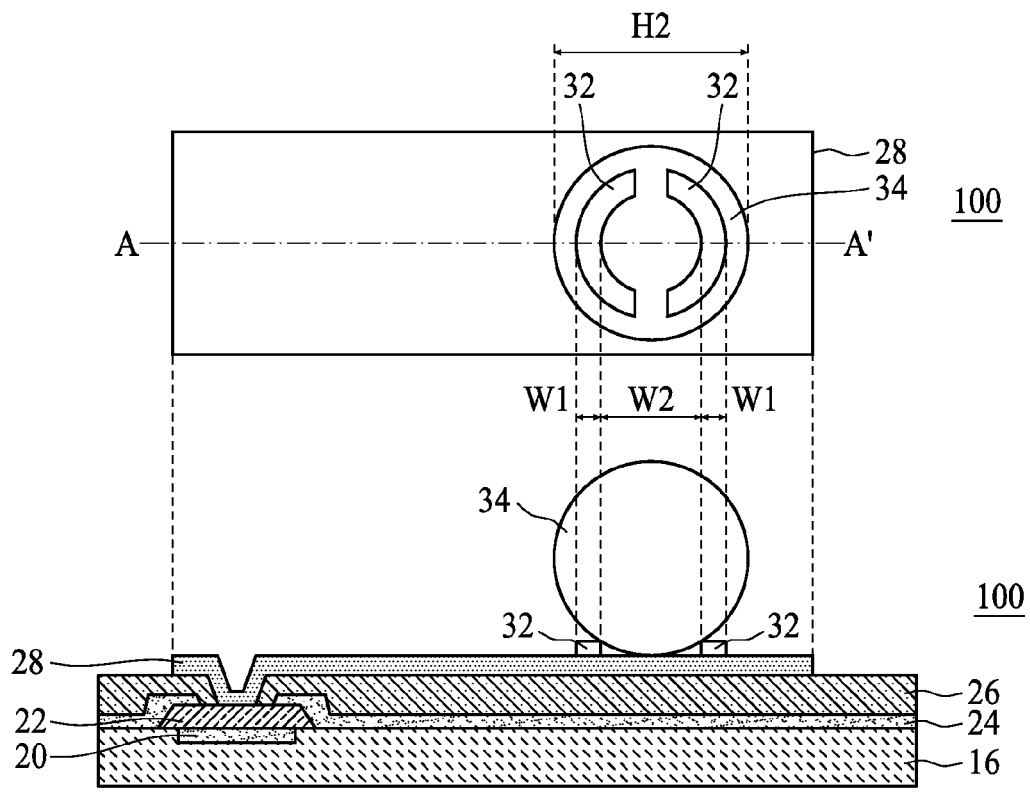
Figure 11:
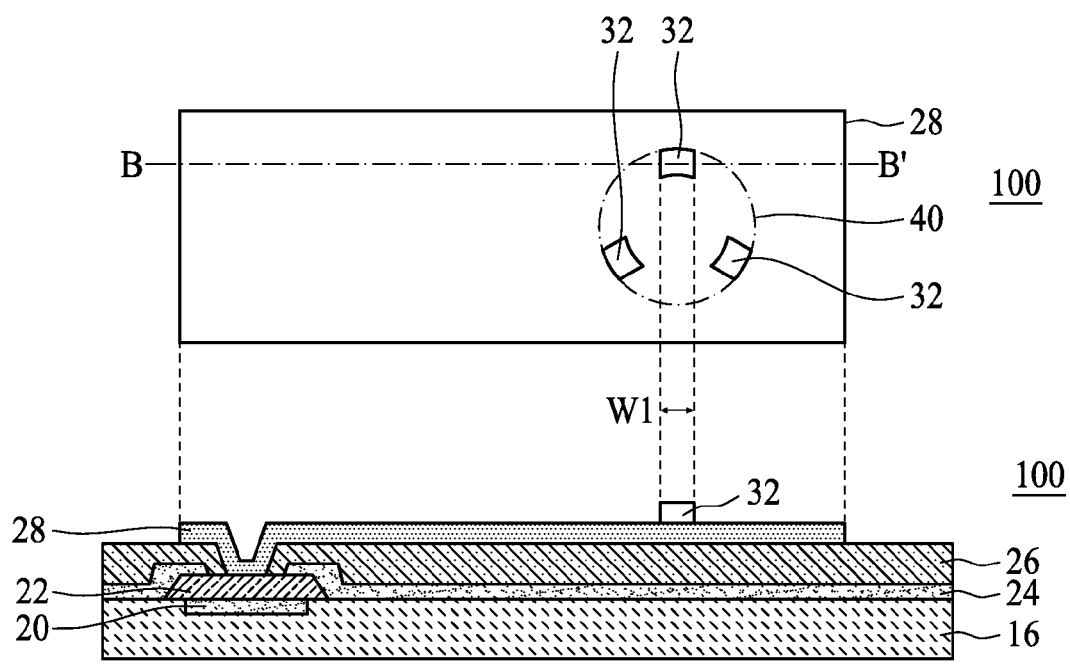

FIGS. 9-11 illustrate various top-views and corresponding cross-sectional views of a semiconductor device in accordance with some embodiments of the present disclosure. Unless specified otherwise, the reference numerals in these embodiments represent like elements in the embodiments illustrated in FIGS. 1-8.

Referring to FIG. 9, in some embodiments in accordance with the present disclosure, a PPI 28 over a metal structure (not depicted) is provided. A positioning member 32 is provided on the surface of the PPI 28. In certain embodiments, the positioning member 32 has a dimension smaller than the PPI 28 and includes two separate portions forming on at least partially enclosed portion 32E at the PPI 28. The at least partially enclosed portion 32E is configured to be substantially symmetrical to a central point 38 of the positioning member 32. In addition, the at least partially enclosed portion 32E is configured to receive a bump. Accordingly, when the bump is disposed around the perimeter of the positioning member 32, the bump will be guided by the portions of the positioning member 32 and align with the central point 38. Once aligned, the positioning member 32 serves to constrain the movement of the bump such that the issue of bump shift may be reduced. In some embodiments, a closest gap W3 between the portions of the positioning member 32 is between about 25 μm and about 125 μm. In certain embodiments, the gap W3 is preserved for purposes of easiness of manufacture. However, the positioning member 32 may include any numbers of portions and the widths between such portions are not limited as long as the positioning member 32 may serve the function of accommodating the bump and restraining the position of the bump at the predetermined position.

In some embodiments in accordance with the present disclosure, the lower portion of FIG. 9 illustrates a cross-section view of the semiconductor structure from line A to A'. The positioning member 32 is provided over the PPI 28. In addition, the positioning member 32 includes two protruding portions at least partially enclosing a portion 32E. The portion 32E has a width W2 and is configured to receive the bump. In addition, the width W2 of the portion 32E is smaller than the diameter of the bump. In some embodiments, the protruding portion of the positioning member 32 has a width W1. Detailed features of the widths W1 and W2 have been provided in the previous disclosure and will not be repeated.

In some embodiments in accordance with the present disclosure, referring to FIG. 10, a bump 34 is disposed over the PPI 28 and the positioning member 32. The bump 34 in FIG. 10 is transparent such that the positioning member 32 below can be demonstrated. The transparency of the bump 34 may be changed in certain embodiments. In some embodiments, after being placed over the PPI 28, the bump 34 is trapped by the positioning member 32. Two portions of the positioning member 32 may serve to clip the bump 34 there-between such that the position of the bump 34 is maintained. In certain embodiments, the diameter H2 of the bump 34 is larger than an outer dimension (W1+W2+W1) of the positioning member 32. It should be noted that the placement of the positioning member 32 in FIGS. 9 and 10 is provided for illustrative purposes only and that the specific locations and patterns of the positioning member 32 may vary and may include, for example, an array, a line, a staggered pattern or the like. The illustrated positioning member 32 sizes are provided for reference only and are not intended to be actual sizes or actual relative sizes.

In some embodiments in accordance with the present disclosure, referring to FIG. 11, the positioning member 32 has three portions substantially evenly distributed at an outer perimeter (represented by dotted line 40) of the positioning member 32. Alternatively, the three portions are configured at vertexes of a triangle. In certain embodiments, the three portions are configured at vertexes of a regular triangle. Accordingly, the three portions serve to clip and trap a bump (not depicted) provided there-between. Alternatively, the positioning member 32 may include any number of portions as long as such portions are capable of securing the bump at a predetermined position without disrupting the electric connection between the bump and the PPI 28.

In some embodiments in accordance with the present disclosure, a plurality of bumps are disposed on the PPI 28 and a plurality of corresponding positioning members are deployed to maintain the plurality of bumps at their predetermined positions respectively. As such, the bumps will not move to positions other than the predetermined ones during the semiconductor manufacturing processes. Therefore, electrical connections between the semiconductor device 100 and external devices may be generated through predetermined routes or patterns. Moreover, the plurality of bumps will be separated from each other such that issues such as shortage or bump cross talk may be reduced. In certain embodiments, a pitch between the plurality of bumps on the PPI 28 is between about 300 μm and about 500 μm. The pitch between bumps may be measured from the central point of one bump to the central point of an adjacent bump, or a right/left most point of one bump to a right/left most point of an adjacent bump.

It should also be noted that the placement of the positioning member 32 in FIG. 11 is provided for illustrative purposes only and that the specific locations and patterns of the positioning member 32 may vary and may include, for example, an array, a line, a staggered pattern or the like. The illustrated positioning member 32 sizes are provided for reference only and are not intended to be actual sizes or actual relative sizes.

In some embodiments in accordance with the present disclosure, a semiconductor device having a semiconductor substrate is provided. A metal structure is disposed over the semiconductor substrate. In addition, a post-passivation interconnect (PPI) is disposed over the metal structure. The PPI is configured to receive a bump such that the bump is electrically connected with the semiconductor substrate and the metal structure. A positioning member is disposed over the PPI. The positioning member is configured to accommodate the bump so as to retain the bump at a predetermined position on the surface of the PPI.

In some embodiments in accordance with the present disclosure, a semiconductor device having metal structure overlying a semiconductor substrate is provided. A post-passivation interconnect (PPI) is configured to overly the metal structure. In addition, a positioning member is provided over the PPI. The positioning member is configured to form an at least partially enclosed portion at the top surface of the PPI. Accordingly, a bump deposited over the PPI is accommodated by the positioning member and maintained at a predetermined position. In certain embodiments, the predetermined position is around a center of the portion at least partially surrounded by the positioning member.

In some embodiments in accordance with the present disclosure, a method for manufacturing a semiconductor device is provided. In one operation, a semiconductor substrate is received. In one operation, a post-passivation dielectric (PPI) is provided over the semiconductor substrate. In one operation, a positioning member is provided on the surface of the PPI. In one operation, a bump is aligned with a substantially central point of the positioning member by means of the positioning member. In other words, the positioning member serves to adjust and retain the position of the positioning member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a metal structure over the semiconductor substrate;
   a post-passivation interconnect (PPI) over the metal structure and configured to receive a bump; and
   a positioning member over the PPI, having a partial circular shape and configured to accommodate the bump.

2. The semiconductor device according to claim 1, wherein the PPI includes an upper surface for receiving the bump.

3. The semiconductor device according to claim 1, wherein the PPI is a portion of a redistribution layer (RDL).

4. The semiconductor device according to claim 1, wherein the positioning member includes at least two protruding portions clipping the bump so as to retain the bump at the predetermined position.

5. The semiconductor device according to claim 1, wherein the positioning member includes a cavity for accommodating the bump so as to retain the bump at the predetermined position.

6. The semiconductor device according to claim 1, wherein the bump is configured to be aligned with a substantially central point of the positioning member.

7. The semiconductor device according to claim 1, wherein the bump is electrically connected with the semiconductor substrate through the PPI and the metal structure.

8. The semiconductor device according to claim 1, further comprising a protection layer over the metal structure, the PPI and the positioning member, and the protection layer is configured to at least partially surround the bump.

9. The semiconductor device according to claim 1, wherein the positioning member has a width between about 25 μm and about 125 μm.

10. The semiconductor device according to claim 1, wherein the positioning member has a height allowing the bump to be electrically connected with the PPI when accommodated by the positioning member.

11. A semiconductor device, comprising
   a metal structure overlying a semiconductor substrate;
   a post-passivation interconnect (PPI) overlying the metal structure; and
   a positioning member over the PPI, having a partial circular shape and configured to form an at least partially enclosed portion at the PPI so as to accommodate a bump and retain the bump at a predetermined position.

12. The semiconductor device according to claim 11, wherein the positioning member is smaller in dimension than that of the PPI.

13. The semiconductor device according to claim 11, wherein the positioning member includes at least two portions substantially symmetrical to a central point of the positioning member.

14. The semiconductor device according to claim 13, wherein a closest width between the at least two portions is between about 25 μm and about 125 μm.

15. The semiconductor device according to claim 11, wherein the positioning member includes at least three portions substantially evenly distributed at an outer perimeter of the positioning member.

16. The semiconductor device according to claim 11, wherein a diameter of the bump is larger than an outer dimension of the positioning member.

17. The semiconductor device according to claim 11, wherein a pitch between the bump and an adjacent bump is between about 300 μm and about 500 μm.

18. A method for manufacturing semiconductor device, comprising:
   receiving a semiconductor substrate;
   providing a post-passivation dielectric (PPI) over the semiconductor substrate;
   providing a positioning member on a surface of the PPI; and
   aligning a bump with a substantially central point of the positioning member by means of the positioning member having a partial circular shape.

19. The method according to claim 18, further comprising:
   forming the positioning member by epoxy stencil.

20. The method according to claim 18, further comprising:
   adjusting a height of the positioning member to be less than about one-tenth of a diameter of the bump.

* * * * *